(12) United States Patent
Shah et al.

(10) Patent No.: US 12,045,101 B2
(45) Date of Patent: Jul. 23, 2024

(54) SYSTEMS AND METHODS FOR LIQUID IMMERSION COOLING OF TRANSCEIVERS

(71) Applicant: Dell Products L.P., Round Rock, TX (US)

(72) Inventors: Maunish A. Shah, Austin, TX (US); Shree Rathinasamy, Round Rock, TX (US); David Piehler, Mountain View, CA (US)

(73) Assignee: Dell Products L.P., Round Rock, TX (US)

( * ) Notice: Subject to any disclaimer, the term of this patent is extended or adjusted under 35 U.S.C. 154(b) by 48 days.

(21) Appl. No.: 17/476,633

(22) Filed: Sep. 16, 2021

(65) Prior Publication Data

US 2023/0078166 A1 Mar. 16, 2023

(51) Int. Cl.
*G06F 1/20* (2006.01)
*H05K 7/20* (2006.01)
*H04B 10/40* (2013.01)

(52) U.S. Cl.
CPC ........... *G06F 1/20* (2013.01); *H05K 7/20218* (2013.01); *G06F 1/203* (2013.01); *G06F 2200/201* (2013.01); *H04B 10/40* (2013.01)

(58) Field of Classification Search
CPC ...... G06F 1/20; G06F 1/203; G06F 2200/201; H05K 7/20218; H05K 7/20236; H05K 7/20781; H04B 10/40; G02B 6/4266–4273; H01R 13/6581; H01R 24/28; H01R 24/64; H01R 25/006; H01R 2107/00

See application file for complete search history.

(56) References Cited

U.S. PATENT DOCUMENTS

| | | | | |
|---|---|---|---|---|
| 7,859,837 | B2 * | 12/2010 | Nemoz | H05K 7/20563 |
| | | | | 174/15.1 |
| 9,419,380 | B2 * | 8/2016 | Sharf | H01R 13/6471 |
| 2019/0281691 | A1 * | 9/2019 | Matsui | H05K 1/0203 |
| 2020/0026010 | A1 * | 1/2020 | Iwama | G02B 6/4268 |
| 2020/0041737 | A1 * | 2/2020 | Turcotte | G02B 6/4246 |
| 2020/0379164 | A1 * | 12/2020 | Clatanoff | G02B 6/3814 |
| 2021/0132311 | A1 * | 5/2021 | Shearman | G02B 6/4261 |
| 2022/0239198 | A1 * | 7/2022 | Dogruoz | H05K 7/20772 |
| 2022/0357520 | A1 * | 11/2022 | Yang | G02B 6/387 |

* cited by examiner

*Primary Examiner* — Stephen S Sul
(74) *Attorney, Agent, or Firm* — Jackson Walker L.L.P.

(57) ABSTRACT

An information handling resource may include a heat-generating component and a housing configured to house the heat-generating component, the housing comprising a plurality of openings formed thereon such that a liquid coolant may flow between an exterior of the housing and an interior of the housing.

8 Claims, 2 Drawing Sheets

SYSTEMS AND METHODS FOR LIQUID IMMERSION COOLING OF TRANSCEIVERS

TECHNICAL FIELD

The present disclosure relates in general to information handling systems, and more particularly to systems and methods for liquid immersion cooling of an information handling resource of an information handling system, including cooling of a transceiver.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

However, in some instances, some information handling systems may generate a high level of heat such that traditional air mover-based cooling solutions may be insufficient to provide adequate cooling. In such instances, liquid cooling of information handling systems may be preferred, including a technique known as liquid-immersion cooling. In liquid-immersion cooling, an information handling system server rack may be filled with a dielectric liquid (e.g., an electrically-nonconductive oil) and individual information handling system servers may be vertically inserted into the rack. Such dielectric fluid may be actively cooled (e.g., using known liquid refrigeration techniques) and in operation, heat may be transferred from the information handling system servers to the dielectric liquid, thus cooling the information handling system servers and their constituent components.

Many devices in data centers are now designed and implemented to support immersion cooling. However, designs of many peripheral components have not been updated or optimized to take full advantage of cooling capacity offered by immersion cooling. Transceivers, including optical transceivers, are increasingly becoming pivotal components of data centers, but remain among those peripherals in which traditional designs do not take advantage of immersion cooling.

SUMMARY

In accordance with the teachings of the present disclosure, the disadvantages and problems associated with existing approaches to cooling optical networking components and other information handling resources may be reduced or eliminated.

In accordance with embodiments of the present disclosure, an information handling resource may include a heat-generating component and a housing configured to house the heat-generating component, the housing comprising a plurality of openings formed thereon such that a liquid coolant may flow between an exterior of the housing and an interior of the housing.

In accordance with these and other embodiments of the present disclosure, an information handling system may include a processor and an information handling resource communicatively coupled to the processor. The information handling resource may include a heat-generating component and a housing configured to house the heat-generating component, the housing comprising a plurality of openings formed thereon such that a liquid coolant may flow between an exterior of the housing and an interior of the housing.

In accordance with these and other embodiments of the present disclosure, a method may include forming a housing with a plurality of openings formed thereon such that a liquid coolant may flow between an exterior of the housing and an interior of the housing and housing a heat-generating component within the housing.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
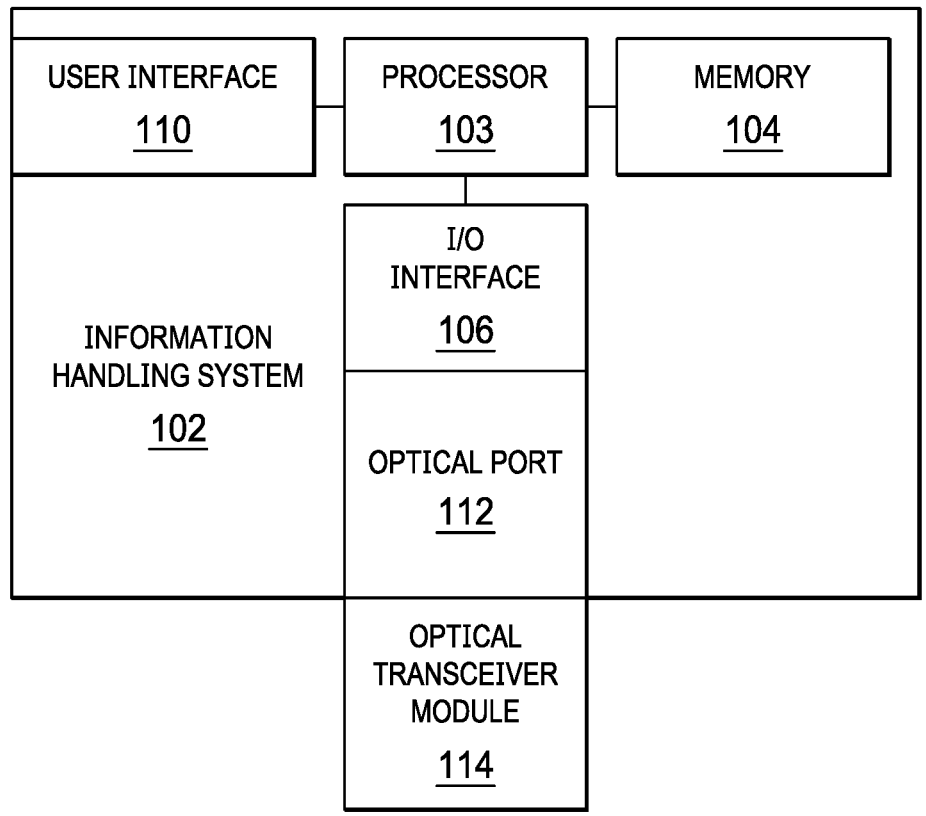
FIG. 1 illustrates a block diagram of selected components of an example information handling system, in accordance with embodiments of the present disclosure.

Preferred embodiments and their advantages are best understood by reference to FIGS. 1 through 4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs) etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a functional block diagram of selected components of an example information handling system 102, in accordance with embodiments of the present disclosure. In some embodiments, information handling system 102 may be a personal computer (e.g., a desktop computer or a portable computer). In other embodiments, information handling system 102 may comprise a storage server for archiving data.

As depicted in FIG. 1, information handling system 102 may include a processor 103, a memory 104 communicatively coupled to processor 103, an input/output interface 106 communicatively coupled to processor 103, a user interface 110 communicatively coupled to processor 103, and an optical port 112 communicatively coupled to I/O interface 106.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104, and/or another component of information handling system 102.

Memory 104 may be communicatively coupled to processor 103 and may include any system, device, or apparatus configured to retain program instructions and/or data for a period of time (e.g., computer-readable media). Memory 104 may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to its associated information handling system 102 is turned off.

I/O interface 106 may comprise any suitable system, apparatus, or device operable to serve as an interface between information handling system 102 and one or more other external devices. For example, in some embodiments, I/O interface 106 may comprise a network interface configured to serve as an interface between information handling system 102 and other information handling systems via a network, in which case I/O interface 106 may comprise a network interface card, or "NIC."

User interface 110 may comprise any instrumentality or aggregation of instrumentalities by which a user may interact with information handling system 102. For example, user interface 110 may permit a user to input data and/or instructions into information handling system 102, and/or otherwise manipulate information handling system 102 and its associated components. User interface 110 may also permit information handling system 102 to communicate data to a user, e.g., by way of a display device.

Optical port 112 may comprise an electrical connector in the form of any suitable combination of a jack, a socket, and/or "cage" for receiving a corresponding connector of an optical transceiver module 114.

Optical transceiver module 114 may include any system, device, or apparatus that houses and includes an optical transceiver configured to convert an incoming optical signal into an equivalent electrical signal, and communicate such equivalent electrical signal to I/O interface 106, and also configured to receive an electrical signal from I/O interface 106, convert such electrical signal into an equivalent optical signal, and communicate such optical signal as an outgoing optical signal (e.g., via an optical cable, which may be integral to the same assembly as optical transceiver module 114). Optical transceiver module 114 may include a small form-factor pluggable (SFP) transceiver, a quad small form-factor pluggable (QSFP) transceiver, or any other suitable form factor.

In addition to processor 103, memory 104, I/O interface 106, user interface 110, optical port 112, and optical transceiver module 114, information handling system 102 may include one or more other information handling resources. Such an information handling resource may include any component system, device or apparatus of an information handling system, including without limitation, a processor, bus, memory, I/O device and/or interface, storage resource (e.g., hard disk drives), network interface, electro-mechanical device (e.g., fan), display, power supply, and/or any portion thereof. An information handling resource may comprise any suitable package or form factor, including without limitation an integrated circuit package or a printed circuit board having mounted thereon one or more integrated circuits.

Figure 2:
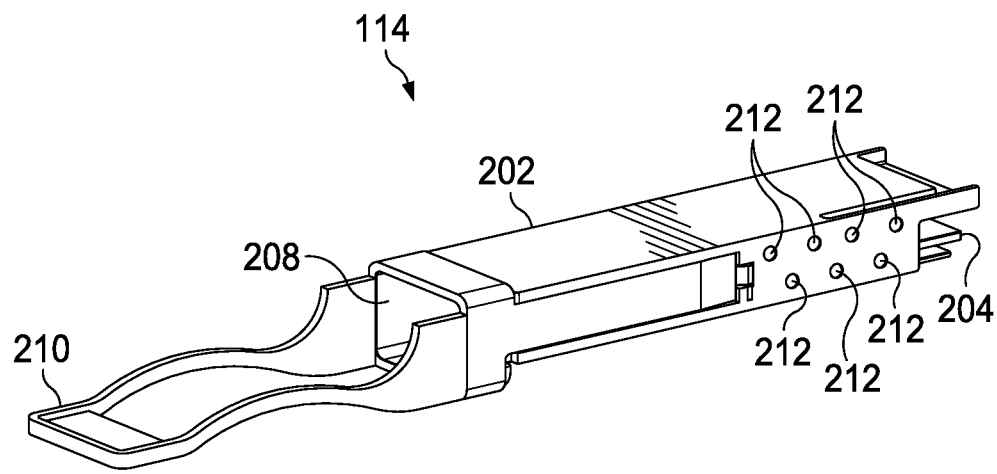
FIG. 2 illustrates a perspective view of an example optical transceiver module, in accordance with embodiments of the present disclosure.

FIG. 2 illustrates a perspective view of an example optical transceiver module 114, in accordance with embodiments of the present disclosure. In some embodiments, example optical transceiver module 114 depicted in FIG. 2 may be used to implement optical transceiver module 114 of FIG. 1. As shown in FIG. 2, optical transceiver module 114 may include a housing 202 for housing an optical transceiver 204 and one or more other components, a connector 208 for receiving a corresponding cable, and a pull tab 210. Housing 202 may comprise a metal enclosure configured to house and/or provide mechanical structure for optical transceiver 204, including mechanical features (e.g., guiding features) for aligning and/or mechanically securing optical transceiver 204 to I/O interface 106 via optical port 112.

Optical transceiver 204 may include any system, device, or apparatus configured to receive an incoming optical signal (e.g., via a cable received within connector 208), convert the incoming optical signal into an equivalent electrical signal, and communicate such equivalent electrical signal to I/O interface 106 (e.g., via optical port 112), and also configured to receive an electrical signal from I/O interface 106 (e.g., via optical port 112), convert such electrical signal into an equivalent optical signal, and communicate such optical signal as an outgoing optical signal (e.g., via cable received within connector 208).

Connector 208 may include any suitable system, device, or apparatus capable of communicatively coupling to a cable (e.g., an optical cable comprising one or more optical fibers). Accordingly, connector 208 may communicatively couple such one or more optical fibers integral to the cable to optical transceiver 204, thus enabling communication with optical transceiver 204 via such optical fibers.

Pull tab 210 may comprise a handle or other mechanical feature that may enable a person to readily insert optical transceiver module 114 into optical port 112 and/or readily remove transceiver module 114 from optical port 112.

As also depicted in FIG. 2, housing 202 may have a plurality of openings 212 formed therein. In some embodiments, openings 212 may be formed only on the lateral sides of housing 202 (e.g., sides of housing 202 generally parallel with the axis of a cable inserted into connector 208 and perpendicular to the bottom side of housing 202 which, when optical transceiver module 114 is received into optical port 112, may be proximate to where optical port 112 is mounted to a circuit board). Although not explicitly shown in FIG. 2, housing 202 may have openings 212 formed on both lateral sides of housing 202. In some of such embodiments, openings 212 formed on opposite lateral sides of housing 202 may be aligned such that a line perpendicular to a surface of a first lateral side and entering an opening 212 on the first lateral side may also pass through a corresponding opening on a second lateral side opposite the first lateral side.

Figure 3:
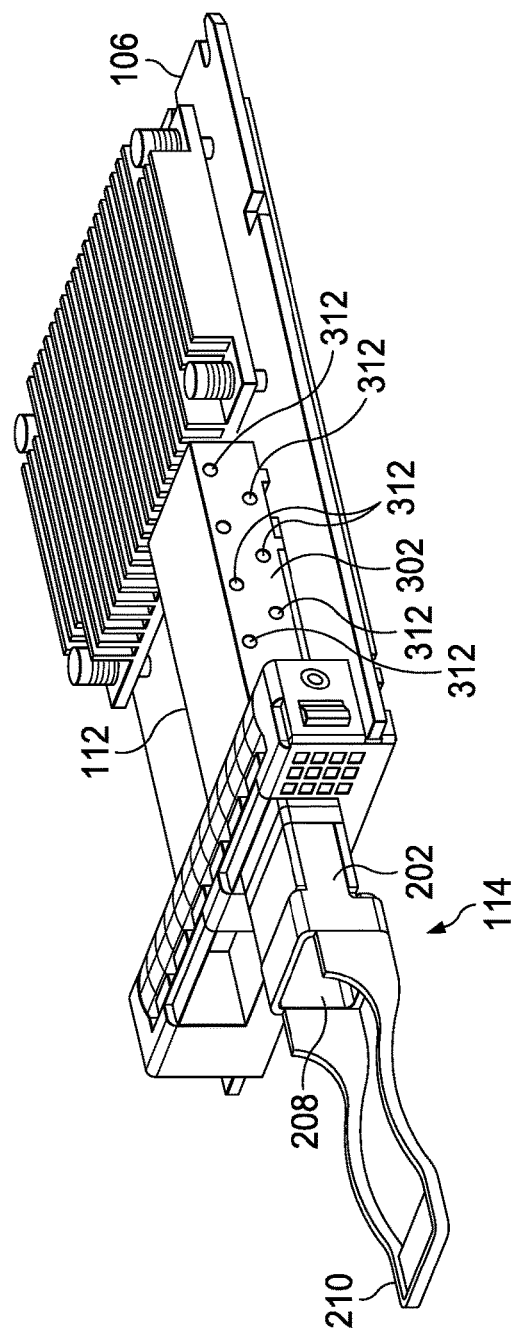
FIG. 3 illustrates a perspective view of two instances of the example optical transceiver module shown in FIG. 2 inserted into respective optical ports of an I/O interface, in accordance with embodiments of the present disclosure.

FIG. 3 illustrates a perspective view of two instances of example optical transceiver module 114 shown in FIG. 2 inserted into respective optical ports 112 of I/O interface 106, in accordance with embodiments of the present disclosure. As shown in FIG. 3, a housing 302 of optical port 112 may have a plurality of openings 312 formed therein. In some embodiments, openings 312 may be formed only on the lateral sides of housing 302 (e.g., sides of housing 302 generally parallel with the axis of a cable inserted into connector 208 and perpendicular to the bottom side of housing 302 at which optical port 112 is mounted to a circuit board). Although not explicitly shown in FIG. 3, housing 302 may have openings 312 formed on both lateral sides of housing 302. In some of such embodiments, openings 312 formed on opposite lateral sides of housing 302 may be aligned such that a line perpendicular to a surface of a first lateral side and entering an opening 312 on the first lateral side may also pass through a corresponding opening on a second lateral side opposite the first lateral side. Further, openings 312 may be arranged such that when optical transceiver module 114 is fully inserted into optical port 112, each opening 212 may substantially overlap with a corresponding opening 312 thus permitting flow of fluid (e.g., a dielectric coolant liquid) between the exterior of housing 302 and the interior of housing 202, and vice versa.

Figure 4:
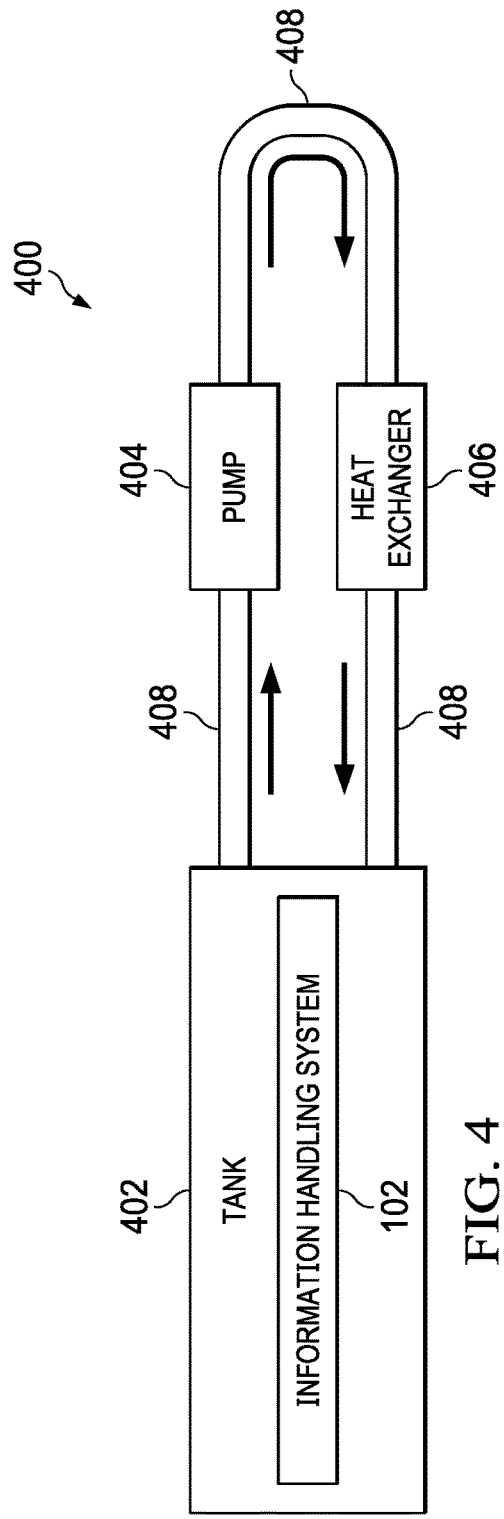
FIG. 4 illustrates a block diagram of a system for immersion cooling of an information handling system, in accordance with embodiments of the present disclosure.

FIG. 4 illustrates a block diagram of a system 400 for immersion cooling of an information handling system 102, in accordance with embodiments of the present disclosure. As shown in FIG. 4, system 400 may include a tank 402, a pump 404, a heat exchanger 406, and a plurality of fluidic conduits 408.

Tank 402 may include any suitable vessel for containing a dielectric coolant liquid (e.g., a generally non-electrically conductive oil). Information handling system 102 may be submerged in such dielectric coolant liquid such that the dielectric coolant liquid comes in physical contact with multiple information handling resources of information handling system 102, including optical port 112 and optical transceiver module 114. For purposes of clarity and exposition, tank 402 is depicted as having only a single information handling system 102 submerged within. However, in some embodiments, tank 402 may be configured to have submerged within a rack housing a plurality of information handling systems 102.

Tank 402 may be fluidically coupled to a pump 404 and a heat exchanger 406 via respective fluidic conduits 408, which in turn may be fluidically coupled to each other via a respective fluidic conduit.

Pump 404 may comprise any mechanical or electro-mechanical system, apparatus, or device operable to produce a flow of liquid (e.g., a flow of dielectric coolant liquid).

Heat exchanger 406 may comprise any system, device, or apparatus configured to transfer heat from fluid flowing within and/or proximate to heat exchanger 406 to an ambient environment (e.g., air). For example, heat exchanger 406 may comprise a refrigerator, radiator, and/or combination thereof.

In operation, pump 404 may drive the flow of heated dielectric liquid coolant from pump 404 to heat exchanger 406, where heat exchanger 406 may cool the dielectric liquid coolant. Further, responsive to pressure applied by pump 404, the cooled dielectric liquid coolant may be delivered from heat exchanger 406 to tank 402.

In some embodiments, information handling system 102 may be physically arranged within tank 402 such that the fluid flows across components of information handling system 102, transferring heat from such components to the dielectric liquid coolant. For example, optical port 112 and optical transceiver module 114 may be arranged within information handling system 102 and tank 402 such that dielectric liquid coolant is driven from an exterior of a housing 302 of optical port 112 to an interior of housing 202 of optical transceiver module 114 via openings 212 and openings 312 on one lateral side of optical port 112 and optical transceiver module 114, and then driven from the interior to the exterior via openings 212 and openings 312 on an opposite lateral side of optical port 112 and optical transceiver module 114, thus cooling components integral to optical transceiver module 114.

Pump 408 may draw heated dielectric liquid coolant from tank 402, and again drive the dielectric liquid coolant to heat exchanger 406 for cooling.

Although openings 212 (and corresponding openings 312) may be formed at any suitable locations along the lateral sides of housing 202 of optical transceiver module 114, in some embodiments, openings 212 may be formed proximate to components and/or regions of optical transceiver module 114 expected to generate the most heat.

Further, although housing 202 of optical transceiver module 114 may comprise any suitable number of openings 212 and openings 212 may have any suitable size and/or shape, in some embodiments openings 212 (and corresponding openings 312) may be sized, shaped, and/or arranged about housing 202 to appropriately balance design tradeoffs between a desirable amount of flow of dielectric liquid coolant through housing 202 and a desirable amount of electromagnetic shielding of electronic components of optical transceiver module 114.

In addition, while openings 212 are shown in FIG. 2 on the lateral sides of housing 202 (and corresponding openings 312 are shown in FIG. 3 on the lateral sides of housing 302), in some embodiments, openings 212 may be formed on other surfaces of housing 202 and openings 312 may be formed on other surfaces of housing 302. However, in some instances, it may be undesirable or unfeasible to form openings 212 and openings 312 on the bottom of housing 202 and housing 302, respectively, as such openings may interfere with mechanical and electrical coupling of optical port 112 to a circuit board of information handling system 102. Further, in these and other instances, it may be undesirable or unfeasible to form openings 212 and openings 312 on the top of housing 202 and housing 302, respectively, as such openings may interfere with mechanical and thermal coupling of a heatsink to housing 302 of optical port 112.

Further, while each opening 212 may align with a respective opening 312 when optical transceiver module 114 is fully inserted into optical port 112, in some embodiments, each respective opening 312 may not align with a respective opening 212. In such embodiments, an optical port 112 may be "universal" and may have an arrangement of openings 312 such that optical port 112 may receive a plurality of different types of optical transceiver modules 114 having different arrangements of openings 212 while enabling the openings 212 of each different type of optical transceiver modules 114 to align with respective corresponding openings of optical transceiver module 114.

Although the foregoing contemplates the use of the methods and systems disclosed herein with respect to an optical port, the heat transfer techniques disclosed herein may be applied generally to cooling of any suitable information handling resource.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling resource comprising:
   a resource housing comprising a plurality of openings formed thereon such that a liquid coolant may flow between an exterior of the resource housing and an interior of the resource housing; and
   one or more components within the resource housing;
   wherein the resource housing is configured to mechanically secure at least one of the one or more components to an I/O interface;
   wherein the information handling resource comprises an optical transceiver module and the one or more components include an optical transceiver;
   wherein the optical transceiver module is configured to be received into an optical port housing of an optical port
   wherein the plurality of openings include a first plurality of openings on a first lateral side of the resource housing and a second plurality of openings on a second lateral side of the resource housing;
   wherein each of the first plurality of openings is aligned with a corresponding one of the second plurality of openings;
   wherein each of the plurality of openings is arranged wherein, when the optical transceiver module is fully received within the optical port, each of the plurality of openings aligns with a corresponding optical port opening on the optical port housing.

2. The information handling resource of claim 1, wherein the first lateral side and the second lateral side comprise opposing lateral sides, which are generally perpendicular to a bottom side of the resource housing.

3. The information handling resource of claim 2, further comprising:
   a pull tab including a handle to facilitate insertion of the optical transceiver module into the optical port.

4. The information handling resource of claim 1, wherein the plurality of openings is formed in proximity to the optical transceiver.

5. An information handling system comprising:
   a processor; and
   an information handling resource communicatively coupled to the processor, and comprising:
      a resource housing comprising a plurality of openings formed thereon such that a liquid coolant may flow between an exterior of the resource housing and an interior of the resource housing; and
      one or more components within the resource housing;
      wherein the resource housing is configured to mechanically secure at least one of the one or more components to an I/O interface;
   wherein the information handling resource comprises an optical transceiver module and the one or more components include an optical transceiver;
   wherein the optical transceiver module is configured to be received into an optical port housing of an optical port
   wherein the plurality of openings include a first plurality of openings on a first lateral side of the resource housing and a second plurality of openings on a second lateral side of the resource housing;
   wherein each of the first plurality of openings is aligned with a corresponding one of the second plurality of openings;
      wherein each of the plurality of openings is arranged wherein, when the optical transceiver module is fully received within the optical port, each of the plurality of openings aligns with a corresponding optical port opening on the optical port housing.

6. The information handling system of claim 5, wherein the first lateral side and the second lateral side comprise opposing lateral sides, which are generally perpendicular to a bottom side of the housing that is proximate to where the optical port housing couples to a circuit board.

7. The information handling system of claim 6, further comprising:
   a pull tab including a handle to facilitate insertion of the optical transceiver module into the optical port.

8. The information handling system of claim 5, wherein the plurality of openings is formed in proximity to the optical transceiver.

* * * * *